United States Patent [19]
Gutierrez et al.

[11] 4,286,373
[45] Sep. 1, 1981

[54] METHOD OF MAKING NEGATIVE ELECTRON AFFINITY PHOTOCATHODE

[75] Inventors: William A. Gutierrez; Herbert L. Wilson, both of Woodbridge; Edward M. Yee, Burke, all of Va.

[73] Assignee: The United States of America as represented by the Secretary of the Army, Washington, D.C.

[21] Appl. No.: 110,513

[22] Filed: Jan. 8, 1980

[51] Int. Cl.[3] .............................................. H01L 31/18
[52] U.S. Cl. ......................................... 29/572; 313/94; 313/346 R; 148/171; 148/175; 156/655; 156/662
[58] Field of Search .................. 29/572; 136/258, 262; 148/175, 171; 357/30; 250/211 R; 313/94, 346 R; 156/655, 662

[56] References Cited

U.S. PATENT DOCUMENTS

| | | | |
|---|---|---|---|
| 3,673,011 | 6/1972 | Strull | 148/175 |
| 3,951,698 | 4/1976 | Wilson et al. | 148/33.4 |
| 3,959,045 | 5/1976 | Antypas | 156/630 |
| 4,128,733 | 12/1978 | Fraas et al. | 136/255 |

OTHER PUBLICATIONS

G. A. Antypas et al. "Glass-Sealed GaAs-AlGaAs Transmission Photo-Cathodes", *Appl. Phys. Lett.*, vol. 26, pp. 371-372 (1975).

*Primary Examiner*—Aaron Weisstuch
*Attorney, Agent, or Firm*—Nathan Edelberg; Milton W. Lee; Aubrey J. Dunn

[57] ABSTRACT

A method of making transmission mode glass-sealed negative electron affinity (NEA) gallium arsenide (GaAs) photocathodes, utilizing germanium (Ge) as the seed crystal and multilayers of GaAs and gallium aluminum arsenide (GaAlAs) grown by metal alkyl-hydride vapor-phase epitaxy. The GaAs serves as the photoemitting layer and the GaAlAs serves as the passivating layer. The Ge, GaAs,GaAlAs combination is sealed to a glass support substrate which serves as the input window for the device. Finally, the Ge is removed and the GaAs is activated.

2 Claims, 1 Drawing Figure

STEP 1
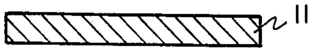
STEP 2
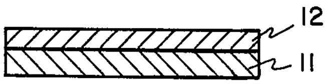
STEP 3
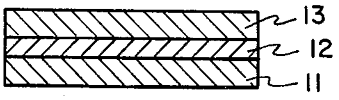
STEP 4
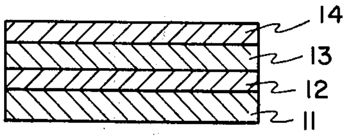
STEP 5
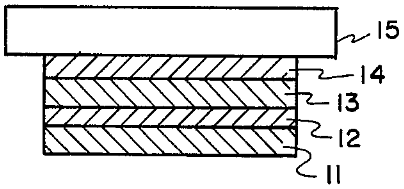
STEP 6
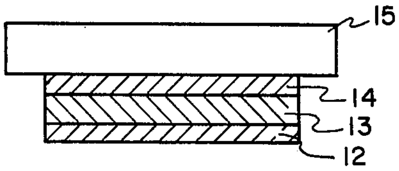
STEP 7
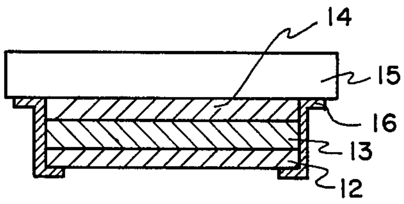
STEP 8
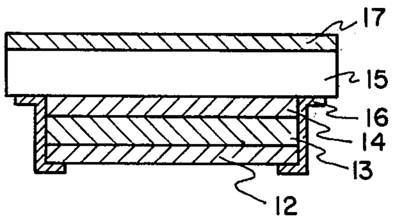

METHOD OF MAKING NEGATIVE ELECTRON AFFINITY PHOTOCATHODE

The invention described herein may be manufactured, used, and licensed by the U.S. Government for governmental purposes without the payment of any royalties thereon.

BACKGROUND OF THE INVENTION

1. Field of the Invention

This invention is in the field of photocathodes and more specifically to glass sealed transmission-made negative electron affinity (NEA) GaAs photocathodes.

2. Description of the Prior Art

Various types of photocathodes are known in the art, and usual for these types are multialkali types. However, NEA photocathodes are capable of luminous sensitivities far in excess of the valves exhibited by multialkali photocathodes. In order to obtain a high-performance NEA GaAs transmission photocathode it is necessary to have a uniformly thin and blemish-free p+ GaAs layer with a long minority carrier diffusion length (high crystal quality) on a transparent substrate with a low recombination velocity (passivated) at the photon input interface. Additionally, the photocathode surface must be readily heat cleaned in vacuum at about 600° C. so that it can be activated with cesuim (Cs) and oxygen ($O_2$) to a state of NEA. A number of approaches have been tried in attempts to realize these requirements, including (a) GaAs/$Al_2O_3$, (b) GaAs/GaP, (c) GaAs/GaAsP/GaP, (d) GaAs/GaAlAs/GaP, (e) GaAs/GaAlAs/GaAs (a rim-supported structure, (f) GaAs/GaAlAs/GaP (hybrid structure), and (g) GaAs/GaAlAs/glass (glass-sealed structure). All these structures are prepared using any one of the following growth techniques: vapor phase epitaxy (using halogen transport); liquid phase epitaxy; or a combination of both vapor and liquid phase epitaxy (hybrid epitaxy). With the exception of (a) all the other methods use either GaAs or GaP as the seed crystal for epitaxial growth. Sapphire ($Al_2O_3$) is not suitable as a seed crystal due to the inferior photocathode crystal quality resulting from poor lattice match. Unfortunately, GaAs and GaP seed crystals are expensive and of limited diameter. In addition, both GaAs and GaP are currently manufactured with inferior crystal quality as compared with the Ge crystals used with the instant invention.

SUMMARY OF THE INVENTION

The instant invention is a method of making a photodetector wherein Ge is used as the seed crystal for epitaxial growth of the GaAs/GaAlAs layers instead of GaAs or GaP as in previous methods. The use of Ge allows the production of cheaper, larger and higher performance photocathodes than those produced by the previous methods. The production is cheaper because Ge is a cheap seed crystal, and may be used in a cheap process, this process also being more amenable to volume production than the previous methods of forming glass-sealed photocathodes. Larger photodetectors may be produced since Ge is available in much larger diameters than GaAs or GaP. When Ge, instead of GaAs, is used as the seed crystal, the preferential removal of the seed crystal, which is an essential step in the glass-sealed photocathode fabrication process, can be performed more effectively. This is due to the difference in the chemical nature of Ge compared with GaAs and GaAlAs. The end result is a minimum number of defects and blemishes in the photocathode layers, leading to an increase in manufacturing yield.

It should be noted that Ge is mechanically stronger and manufactured to much higher crystal quality than either GaAs or GaP and has a very close lattice and thermal expansion coefficient match to GaAs and GaAlAs. These matches allow high quality epitaxial growth.

Briefly, the invention uses the metal alkyl-hydride vapor phase process, in conjunction with the use of Ge seed crystals, for the epitaxial growth of the III–V layers. This allows the GaAs and GaAlAs layers to be grown by vapor phase technique in a single growth sequence.

BRIEF DESCRIPTION OF THE DRAWINGS

The single drawing FIGURE is a flow chart for the method of the invention.

DESCRIPTION OF PREFERRED EMBODIMENTS

The method of the invention may perhaps be best understood in view of the drawing flow chart. In step 1, a <100> oriented undoped Ge seed 11 from 5 to 20 mils (0.127–0.508 mm) thick and 15–60 mm in diameter is prepared for epitaxial growth by chemically polishing the growth surface in a standard Ge polishing etch to remove any residual damage and contamination introduced by previous lapping and polishing steps. In step 2, a 2–4 micron thick zinc-doped (approx $5\text{–}50\times10^{18}$ $cm^{-3}$) GaAs photoemitting layer 12 is epitaxially grown on the surface of seed crystal 11 using the metal alkyl-hydride vapor phase process with a reagent chosen from the group consisting of: trimethylgallium, arsine, diethylzinc and hydrogen. Using the same growth technique and by addition of an indium source, a GaInAs photoemitting layer with a longer wavelength response than GaAs can be grown. In step 3, a $Ga_xAl_{l-x}As$ (x=0.3 to 0.7) zinc doped (approx $5\text{–}50\times10^{17}$ $cm^{-3}$) passivating layer 13 is epitaxially grown to a thickness of 5–15 microns on photoemitting layer 12 using the same process and reagents as used for the growth of 12 with the exception of the addition of trimethylgallium to the group. In step 4, a GaAlAs or glass antireflection coating 14 is applied by any well known technique, such as chemical vapor deposition or RF sputtering. Several materials are suitable, such as silicon dioxide ($S_1O_2$), silicon nitride ($Si_3N_4$), or multilayer combinations thereof. Layer 14 serves the dual purpose of antireflection coating and glass-sealing interface layer. In step 5, the structure composed of 11, 12, 13, and 14 is fusion bonded to a 7056 glass plate 15 using a thermal-pressure technique. Corning glass 7056 is preferred since it has a thermal expansion coefficient close to that of GaAs and Ge and a transformation point high enough to enable the photocathode to go through all the processing steps without deterioration. Other glasses with equal or better thermal expansion match may be used. The glass faceplate is made so that it can serve as the input faceplate when the photocathode is incorporated in a tube structure. In step 6, the Ge seed 11 is removed preferentially from 12 using a suitable chemical etch. In steps 7 and 8, ohmic contact 16 and glass/air antireflection coating 17 are applied to complete the photocathode structure. Ohmic contact 16, which may be chromium, Inconel, or any other suitable metal, is applied to a thickness of approximately 500

Angstroms by either vaporation or sputtering to the periphery of layer 12 in order that electrical connection can be made to the photocathode.

When the photocathode is constructed according to the process described above and the GaAs photoemitting layer is activated to a state of NEA by heat cleaning in vacuum and applying, by well known techniques, monolayer amounts of cesium and oxygen, it exhibits highly improved performance over conventional photocathodes. The photocathode functions with radiation impinging on the glass faceplate side and photoelectrons being emitted into the vacuum from the activated GaAs surface 12.

We claim:

1. A method of making a glass-sealed transmission mode gallium arsenide photocathode comprising the steps of:

(a) preparing a germanium seed crystal for epitaxial growth;

(b) epitaxially growing a p-doped gallium arsenide photoemitting layer onto the prepared germanium crystal using the metal alkyl-hydride vapor-phase process;

(c) epitaxially growing a p-doped gallium aluminum arsenide passivating layer onto said photoemitting layer using the metal alkyl-hydride vapor-phase process;

(d) depositing a suitable antireflection or interface layer onto said passivating layer;

(e) fusion bonding the antireflection or interface layer surface of the structure composed of seed crystal, photoemitting layer, passivating layer, and antireflection or interface layer to a glass faceplate that serves as the input window of the device;

(f) preferentially etching away the exposed germanium seed crystal to expose the photoemitting layer;

(g) applying ohmic contact to the periphery of said photoemitting layer for effecting electrical contact to the photocathode;

(h) applying a suitable glass/air antireflection coating on the exposed photon input side of the glass window; and (i) activating the photoemitting layer by heat cleaning in vacuum and applying monolayer amounts of cesium and oxygen to the photoemitting layer.

2. The method of claim 1 wherein the composition of the gallium arsenide photoemitting layer is modified by the incorporation of indium to form gallium indium arsenide.

* * * * *